United States Patent
Kasper et al.

(10) Patent No.: US 9,211,851 B2
(45) Date of Patent: Dec. 15, 2015

(54) METHOD FOR ELIMINATING ELECTRICAL SHORT CIRCUITS

(71) Applicant: GM GLOBAL TECHNOLOGY OPERATIONS LLC, Detroit, MI (US)

(72) Inventors: Mario Kasper, Ruesselsheim (DE); Christian Steinert, Filsen (DE)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 154 days.

(21) Appl. No.: 13/966,464

(22) Filed: Aug. 14, 2013

(65) Prior Publication Data

US 2014/0049858 A1 Feb. 20, 2014

(30) Foreign Application Priority Data

Aug. 16, 2012 (DE) .......................... 10 2012 016 238

(51) Int. Cl.
| | |
|---|---|
| *B60R 16/02* | (2006.01) |
| *H01R 43/00* | (2006.01) |
| *H05K 1/02* | (2006.01) |
| *H05K 3/22* | (2006.01) |
| *H05K 3/34* | (2006.01) |

(52) U.S. Cl.
CPC .............. *B60R 16/02* (2013.01); *H01R 43/002* (2013.01); *H05K 1/0268* (2013.01); *H05K 3/225* (2013.01); *H05K 1/0286* (2013.01); *H05K 3/3421* (2013.01); *H05K 2201/10151* (2013.01); *H05K 2201/10212* (2013.01); *Y10T 29/49117* (2015.01)

(58) Field of Classification Search
USPC .......................................................... 29/825
See application file for complete search history.

(56) References Cited

U.S. PATENT DOCUMENTS

| 3,125,654 A | 3/1964 | Arnold |
| 6,346,034 B1 | 2/2002 | Leng |
| 2003/0057899 A1* | 3/2003 | LaCroix ........................ 318/114 |
| 2003/0134189 A1* | 7/2003 | Kanai et al. ................... 429/156 |

(Continued)

FOREIGN PATENT DOCUMENTS

| DE | 19755185 A1 | 6/1999 |
| JP | 2006134590 A | 5/2006 |

(Continued)

OTHER PUBLICATIONS

German Patent Office, German Search Report for Application No. 102012016238.3, dated Jan. 30, 2013.

*Primary Examiner* — Thienvu Tran
*Assistant Examiner* — Angela Brooks
(74) *Attorney, Agent, or Firm* — Ingrassia Fisher & Lorenz PC

(57) ABSTRACT

A method is provided for eliminating an electrical short circuit that can be caused by a filamentary tin crystal in an electronics assembly in particular of a motor vehicle. The method includes, but is not limited to providing the electronics assembly, that includes, but is not limited to electrical components with connectors and conductor paths for connecting the components. The components have configurable inputs and outputs. At least two of the inputs and outputs of the electrical components are configured so as to form an input connector and an output connector so that in the event of the electrical short circuit caused by the filamentary tin crystal, a short circuit current flows between the input connector and the output connector, which short circuit current is high enough to destroy the filamentary tin crystal.

8 Claims, 3 Drawing Sheets

(56) References Cited

U.S. PATENT DOCUMENTS

| | | | |
|---|---|---|---|
| 2004/0105664 A1* | 6/2004 | Ivankovic | 388/800 |
| 2008/0145756 A1* | 6/2008 | Taniguichi | 429/206 |
| 2012/0144935 A1* | 6/2012 | Murayama et al. | 73/862.626 |
| 2012/0164497 A1* | 6/2012 | Saito et al. | 429/61 |
| 2014/0299351 A1* | 10/2014 | Moser et al. | 174/110 SR |

FOREIGN PATENT DOCUMENTS

| | | |
|---|---|---|
| JP | 2006308506 A | 11/2006 |
| JP | 2007090354 A | 4/2007 |
| JP | 2007335128 A | 12/2007 |
| JP | 2008072799 A | 3/2008 |
| JP | 2010151760 A | 7/2010 |
| JP | 2012148294 A | 8/2012 |

* cited by examiner

METHOD FOR ELIMINATING ELECTRICAL SHORT CIRCUITS

CROSS-REFERENCE TO RELATED APPLICATION

This application claims priority to German Patent Application No. 10 2012 016 238.3, filed Aug. 16, 2012, which is incorporated herein by reference in its entirety.

TECHNICAL FIELD

The technical field relates to a method for eliminating electrical short circuits that are caused by filamentary tin crystals in electronics assemblies of a motor vehicle.

BACKGROUND

For modern motor vehicles, improved environmental compatibility is also increasingly required on the part of the legislator. Thus, for example, it is common practice to replace the previously prevailing leaded solder connections in electronics assemblies by a joining technology without using lead. When constructing electronics assemblies that are used in motor vehicles in various ways in the form of controllers, sensors, navigation systems, entertainment systems or the like, individual components are arranged on circuit boards and are contacted w solder connections.

As is known from the prior art, the use of lead-free soldering materials facilitates the formation of filamentary tin crystals which are also called tin whiskers in English-speaking areas. Filamentary tin crystals preferably grow on galvanically deposited layers and can reach a length of several millimeters which, in compactly arranged components, can cause short circuits between adjacent soldering surfaces and as a result, in the worst case, entire assemblies can fail or only work faultily. In addition to the resulting maintenance costs, this also poses a safety risk since, for example, anti-lock braking systems, airbag systems or similar assemblies are safety-relevant components. Potential failure of assemblies caused by whiskers can either be prevented by avoiding the whisker formation during the tin deposition, or reduced.

From DE 19755185 A1, an aqueous, strongly acidic displacement bath is known for current-free deposition of tin on copper, which in a bath solution of dissolved substances contains tin in the form of a tin-II salt, thiourea or a derivate, 2-thiohydantoin, a fine-grain additive for tin, an emulsifier for the fine-grain additive, if it is insoluble in water, and a surfactant.

It is at least one object is to enable restoring the function of an electronics assembly in the event of a short circuit caused by a filamentary tin crystal, without having to replace the electronics assembly. In addition, other objects, desirable features and characteristics will become apparent from the subsequent summary and detailed description, and the appended claims, taken in conjunction with the accompanying drawings and this background.

SUMMARY

Accordingly, a method is provided for eliminating an electrical short circuit caused by a filamentary tin crystal in an electronics assembly, in particular of a motor vehicle, that includes, but is not limited to: providing the electronics assembly, comprising electrical components with connectors and conductor paths for connecting the components. The components have configurable inputs and outputs. The method also includes, but is not limited to configuring at least two of the inputs and outputs of the electrical components so as to form an input connector and an output connector so that in the event of the electrical short circuit caused by the filamentary tin crystal, a short circuit current flows between the input connector and the output connector, which short circuit current is high enough to destroy the filamentary tin crystal.

By generating controlled short circuits, the whiskers can be destroyed. Software-based activation of inputs and outputs of a plurality of controllers and the sensors, actuators, etc. connected thereto within the vehicle network takes place so as to destroy the tin whiskers. As a result of a predetermined architecture of controllers in the vehicle network, the method can specifically activate inputs and outputs of controllers and thus can generate short circuits between adjacent contacts. In particular at risk from short circuits are conductor paths arranged close to each other as well as the connecting surfaces thereof.

In one embodiment of the method, configuring the inputs and outputs of the electrical components takes place such that adjacent connectors and conductor paths of the electronics assembly are checked successively. Accordingly, destroying or checking for short circuits takes place by successively selecting adjacent connectors and conductor paths that are activated in a predetermined sequence so as to destroy potential short circuits. The sequence can be predetermined in the form of a list based on the known structure of the electronics assembly.

In a further embodiment of the method, the short circuit current is 50 mA or more. Usually, the filamentary tin crystals melt at a current of approximately 10 mA so that accordingly the secure destruction is enabled through said method.

In a further embodiment of the method, the short circuit current is generated by applying electrical potential to the outputs. It is possible here to configure one or a plurality of outputs such that the required short circuit current is obtained so as to enable secure destruction through the method.

In a further embodiment of the method, the electrical components comprise actuators, sensors or controllers. Accordingly, the method can be used with the components that are commonly used for the production of electronic assemblies.

In a further embodiment of the method, configuring the inputs and the outputs of the electrical components takes place with a standardized protocol, preferably according to the AUTOSAR standard. Recent electronics assemblies often support a standardized configuration protocol that is executed, for example, according to the AUTOSAR standard.

In a further embodiment of the method, the electronics assembly is connected to a diagnosis device through which configuring the inputs and the outputs of the electrical components takes place. Accordingly, this method can be started per diagnostic command during the annual repair service. It is also conceivable that in the event of a defect in an electronics assembly, a corresponding message appears which then initiates the start of the method as part of an inspection.

The described method for eliminating an electrical short circuit as well as the advantageous configurations can be implemented with a diagnosis device for a motor vehicle, in particular in a control unit. Advantageously, the control unit has storage including a computer program stored thereon. The computer program serves for carrying out the method.

The control unit can comprise a digital microprocessor unit (CPU) data-linked with a storage system and a bus system, a random access memory (RAM) and storage. The CPU is designed so as to process commands that are implemented as a program stored in the storage, to record input signals from the data bus and to transmit output signals to the data bus. The storage system can comprise different storage media such as optical, magnetic, solid state and other non-volatile media on which a corresponding computer program is stored for carrying out the method and the advantageous configurations. The program can be designed such that it embodies the methods described herein or is able to carry them out so that the CPU can carry out the steps of such methods and thus can control the motor vehicle.

Suitable for carrying out a method is a computer program that has program code so as to carry out all steps of any of the claims when the program is executed on a computer or any other CPU. The computer program can have program code so as to carry out all steps of the method and, where applicable, to carry out the configurations mentioned in the sub-claims when the program is executed. The computer program can be loaded with simple methods into already existing control units and can be used.

Provided for this is a computer program product with a program code that are stored on a computer-readable data carrier so as to carry out the method according to any one of the claims when the program product is executed. The computer program can also be integrated in control units as an upgrade option.

Another embodiment relates to an apparatus for eliminating an electrical short circuit that can be caused by a filamentary tin crystal in an electronics assembly in particular of a motor vehicle, the apparatus comprising an apparatus providing the electronics assembly, comprising electrical components with connectors and conductor paths for connecting the components. The components have configurable inputs and outputs. The apparatus also comprises a second apparatus for configuring at least two of the inputs and outputs of the electrical components so as to form an input connector and an output connector so that in the event of the electrical short circuit caused by the filamentary tin crystal, a short circuit current flows between the input connector and the output connector that is high enough to destroy the filamentary tin crystal.

In one configuration of the apparatus, configuring the inputs and outputs of the electrical components takes place such that adjacent connectors and conductor paths of the electronics assembly are checked successively. In a further configuration of the apparatus, the short circuit current is approximately 50 mA or more.

In a further configuration of the apparatus, the short circuit current is generated by applying electrical potential to the outputs. In a further configuration of the apparatus, the electrical components comprise sensors or controllers. In a further configuration of the apparatus, configuring the inputs and the outputs of the electrical components takes place with a standardized protocol, preferably according to the AUTOSAR standard.

In a further configuration of the apparatus, the electronic assembly is connected to a diagnosis device through which configuring the inputs and the outputs of the electrical components takes place. Furthermore, a diagnosis device comprising a control unit for a motor vehicle is specified that has storage with a computer program stored therein. The computer program is equipped for carrying out the method.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit application and uses. Furthermore, there is no intention to be bound by any theory presented in the preceding background or summary or the following detailed description.

Figure 1:
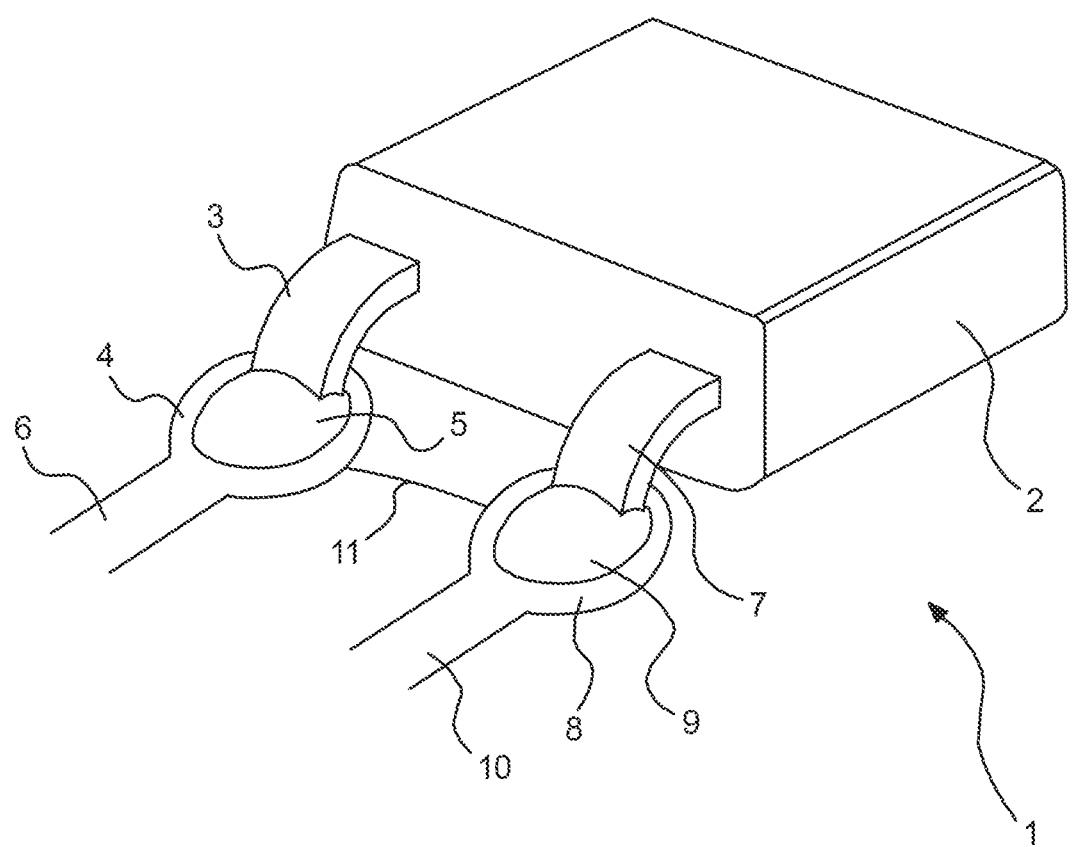
FIG. 1 shows a top view of an electronics assembly with a short circuit.

FIG. 1 shows a cut-out of an electronics assembly 1 that has an electrical component 2. The electrical component 2 has a first connector 3 and is connected with a solder pad 5 to a first conductor path 6 via a first connecting surface 4. Furthermore, the electrical component 2 has a second connector 7 and is connected with a further solder pad 9 to a second conductor path 10 via a second connecting surface 8.

As shown in FIG. 1, a filamentary tin crystal 11 has formed between the first connecting surface 4 and the second connecting surface 8, which tin crystal causes a short circuit between the first connector 3 and the second connector. The arrangement shown here is to be understood only as an example. It is also possible that the filamentary tin crystal 11 causes a short circuit at other places such as, for example, between adjacent components, between conductor paths and connecting surfaces, or between adjacent conductor paths. A short circuit via non-adjacent conductive elements is also conceivable within the context of the embodiments. The electronics assembly 1 can be an electronics module that is used in automotive engineering and comprises a plurality of electrical components 2. They can be implemented, for example, as actuators, sensors or controllers.

Figure 2:
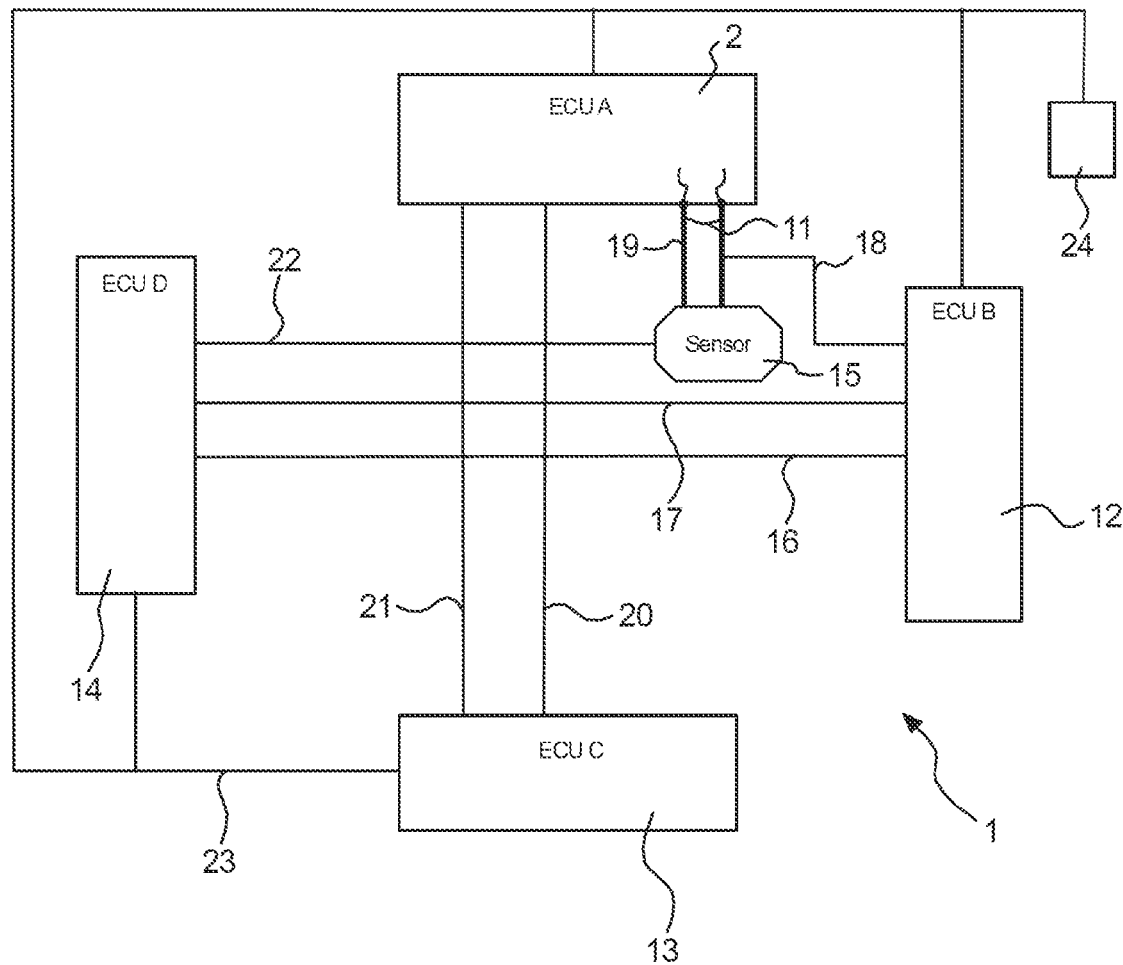
FIG. 2 shows a schematic illustration of an electronics assembly.

The method for eliminating an electrical short circuit that is caused by the filamentary tin crystal 11 in the electronics assembly 1 is explained in more detail with reference to FIG. 2. In addition to the first electrical component 2, the electronics assembly 1 comprises further second to fourth electrical components 12, 13 and 14 implemented as controllers (ECU), and a fifth electrical component 15 implemented as a sensor. The second electrical component 12 is connected to the fourth component 14 via the first and second connecting lines 16 and 17, respectively, and is connected to the fifth component 15 and the first component 2 via a third connecting line 18. The first electrical component 2 is connected to the fifth component 15 via a fourth connecting line 19 and is connected to the third component 13 via the fifth and the sixth connecting line 20 and 21, respectively. Furthermore, the fourth electrical component 14 is connected to the fifth component 15 via a seventh connecting line 22. Finally, the first to the fourth component 2, 12, 13 and 14 are connected to an interface 24 via an eight connecting line 23.

The inputs and outputs of the second, third and fourth electrical component 12, 13, and 14 are now configured such that in the event of the electrical short circuit caused by the filamentary tin crystal 11, a short circuit current flows between the input connector 3 and the output connector 7 of the first component 2, which short circuit current is high enough to destroy the filamentary tin crystal 11. Here, the short circuit current can be approximately 50 mA or more. The short circuit current is generated by applying electrical potential.

Configuring the inputs and outputs of the electrical components 2, 12, 13 and 14 can take place such that adjacent connectors and conductor paths of the electronics assembly are checked successively. Configuring the inputs and the outputs of the electrical components 2, 12, 13 and 14 takes place with a standardized protocol, for example, according to the AUTOSAR standard, via the interface 24. Via the interface 24, the electronics assembly 1 can be connected to a diagnosis device via which configuring the inputs and the outputs of the electrical components takes place.

Figure 3:
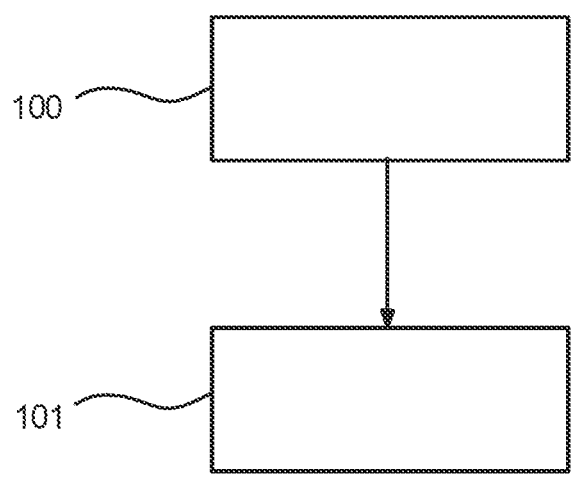
FIG. 3 shows a method according to an embodiment.

The method for eliminating the electrical short circuit that can be caused by the filamentary tin crystal 11 in the electronics assembly 1 of a motor vehicle is summarized again in FIG. 3. Providing the electronics assembly 1 takes place in step 100. In step 101, configuring the inputs and outputs of the electrical components takes place so as to destroy the filamentary tin crystal 11.

While at least one exemplary embodiment has been presented in the foregoing summary and detailed description, it should be appreciated that a vast of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A method for eliminating an electrical short circuit in an electronics assembly in a motor vehicle, comprising:
    connecting electrical components with connectors and conductor paths, wherein the components have configurable inputs and outputs;
    connecting the electronics assembly to a diagnosis device for the configuring at least two of the configurable inputs and the outputs; and
    configuring at least two of the configurable inputs and outputs to form an input connector and an output connector so that in event of the electrical short circuit caused by a filamentary tin crystal, a short circuit current between the input connector and the output connector that substantially destroys the filamentary tin crystal.

2. The method according to claim 1, wherein the configuring at least two of the configurable inputs and outputs successively checking adjacent connectors and conductor paths of the electronics assembly.

3. The method according to claim 1, wherein the short circuit current is approximately greater than 50 mA.

4. The method according to claim 3, further comprising generating the short circuit current with an application of an electrical potential.

5. The method according to claim 1, wherein the electrical components comprise actuators.

6. The method according to claim 1, wherein configuring at least two of the configurable inputs and the outputs is performed with a standardized protocol.

7. The method according to claim 6, wherein the standardized protocol is an AUTOSAR standard.

8. A non-transitory computer readable medium embodying a computer program product, said program product comprising:
    a program for eliminating an electrical short circuit in an electronics assembly in a motor vehicle program, the program configured to:
    connect electrical components with connectors and conductor paths, wherein the components have configurable inputs and outputs;
    connect the electronics assembly to a diagnosis device for the configuring at least two of the configurable inputs and the outputs; and
    configure at least two of the configurable inputs and outputs to form an input connector and an output connector so that in event of the electrical short circuit caused by a filamentary tin crystal a short circuit current between the input connector and die output connector that substantially destroys the filamentary tin crystal.

* * * * *